(12) United States Patent
Eudes

(10) Patent No.: US 8,332,717 B2
(45) Date of Patent: Dec. 11, 2012

(54) METHOD OF IMPROVING THE ITERATIVE DECODING OF CODES

(75) Inventor: Jacques Eudes, Asnieres (FR)

(73) Assignee: Thales, Neuilly sur Seine (FR)

( * ) Notice: Subject to any disclaimer, the term of this patent is extended or adjusted under 35 U.S.C. 154(b) by 1139 days.

(21) Appl. No.: 12/066,119

(22) PCT Filed: Sep. 11, 2006

(86) PCT No.: PCT/EP2006/066227
§ 371 (c)(1),
(2), (4) Date: Jul. 31, 2008

(87) PCT Pub. No.: WO2007/028834
PCT Pub. Date: Mar. 15, 2007

(65) Prior Publication Data
US 2008/0301523 A1    Dec. 4, 2008

(30) Foreign Application Priority Data
Sep. 9, 2005    (FR) .................................. 05 09220

(51) Int. Cl.
*G06F 11/00*    (2006.01)
(52) U.S. Cl. ...................................................... 714/758
(58) Field of Classification Search ................... 714/758
See application file for complete search history.

(56) References Cited

U.S. PATENT DOCUMENTS

| | | | |
|---|---|---|---|
| 6,094,465 A | | 7/2000 | Stein et al. |
| 2002/0124035 A1 * | | 9/2002 | Faber et al. ................... 708/400 |
| 2003/0101402 A1 * | | 5/2003 | Amrani et al. ................ 714/755 |

(Continued)

FOREIGN PATENT DOCUMENTS

| | | |
|---|---|---|
| EP | 1 179 934 | 2/2002 |
| GB | 2 407 945 | 5/2005 |
| JP | 10 303759 | 11/1998 |

OTHER PUBLICATIONS

Gorji Zadeh S A Et al. "An iterative m-algorithm based decoder for convolutional codes." Electrical and Computer Engineering, 2005. Canadian Conference on Saskatoon, SK, Canada May 1-4, 2005, Piscataway, NJ, USA, IEEE, pp. 1626-1629, XP010869088, ISBN: 0-7803-8885-2.

Ali S et al. "An adaptive M-algorithm convolutional decoder." Vehicular Technology Conference, 2005. VTC-2005—Fall. 2005 IEEE 62nd Dallas, TX, USA Sep. 25-28, 2005, Piscataway, NJ, USA, IEEE, pp. 2177-2181, XP010878837, ISBN: 0-7803-9152-7.

*Primary Examiner* — Scott Baderman
*Assistant Examiner* — Jigar Patel
(74) *Attorney, Agent, or Firm* — Lowe, Hauptman, Ham & Berner LLP

(57)    ABSTRACT

Disclosed is a method of improving iterative decoding of short codes within a demodulator. The vector of metrics of the bits considered at the output of the demodulator is decoded. The value of the check code of the CRC of the decoded word is compared with a predetermined value. If the value of the CRC is considered to form an acceptable message for the decoding step, the decoded word is transmitted to the recipient. If the value of the CRC is incompatible with a correctly decoded message, then the parameters for iterative decoding of the initial message are modified that were received from the demodulator and executing at least one new iterative decoding step with these new parameters.

13 Claims, 2 Drawing Sheets

U.S. PATENT DOCUMENTS

| | | |
|---|---|---|
| 2004/0194007 A1* | 9/2004 | Hocevar .................. 714/801 |
| 2004/0260995 A1* | 12/2004 | Allpress .................. 714/755 |
| 2005/0091568 A1 | 4/2005 | Levy et al. |
| 2005/0096777 A1* | 5/2005 | Allan et al. .................. 700/157 |
| 2005/0283708 A1* | 12/2005 | Kyung et al. .................. 714/758 |
| 2007/0011571 A1* | 1/2007 | Bune .................. 714/758 |

* cited by examiner

METHOD OF IMPROVING THE ITERATIVE DECODING OF CODES

CROSS-REFERENCE TO RELATED APPLICATIONS

The present Application is based on International Application No. PCT/EP2006/066227, filed on Sep. 11, 2006, which in turn corresponds to French Application No. 05 09220, filed on Sep. 9, 2005, and priority is hereby claimed under 35 USC §119 based on these applications. Each of these applications are hereby incorporated by reference in their entirety into the present application.

FIELD OF THE INVENTION

The invention relates notably to a method making it possible to improve the iterative decoding of codes from short (some hundred bits) to averagely long (of the MPEG size=1504 bits for example) coded with an error corrector code of low rate such as 1/3 or high rate: 90% or plus. It applies, notably, in the field of telecommunications, for example for satellite communications.

BACKGROUND OF THE INVENTION

In the description, the concept of superiterative decoder is introduced to differentiate an iteration performed within a decoder according to the prior art and the iteration step in the method according to the invention.

Multiple access communications (TDMA time Divisional multiple access) or communications when the latency must be low generally use short or averagely long codes mentioned above (for example of MPEG size).

Under these conditions, for turbo codes within the general sense of the term, including the turbo codes or TPC Turbo Product Codes, the codes obtained by serial concatenation of convolutional codes or SCCC (the abbreviation standing for Serial Concatenated Convolutional Code), the codes obtained by parallel concatenation of convolutional codes or PCCC (the abbreviation standing for Parallel Concatenated Convolutional Code), the low Density Parity Checks LDPC (the abbreviation standing for Low Density Parity Check), in their binary or m-ary variant, a compromise must be found between complexity of decoding and performance of the code.

The principle of iterative decoding is to generate two items of information of local consistency in two dimensions, that are as independent as possible. Independence is notably ensured between the two dimensions by an interleaver.

The size of the code word limits the decoupling between the two dimensions. A reduced size also amplifies the statistical effect of a poor local coding, which is less well compensated by the remainder of the code.

For this reason, codes of small or medium size are today fairly far from the theoretical limit for reasonable decoding complexities.

For codes of large size (greater for example than 5000 information bits), concatenation procedures are known from the prior art, for example LPCD and turbo code concatenations, for reducing the error floor of the turbo code, due to too low a free distance (within the Hamming sense).

Another possibility consists in not reducing the coding rate of the inner code. The coding rate being smaller, the operating point (expressed in Eb/N0 with Eb energy per bit and N0 spectral density of noise and not of the bits coded by the outer code) is not compensated by the gain of the outer code.

When the system uses small codes, either on account of latency problems related to small throughputs such as in telephony, or on account of granularity problems in dynamic-allocation systems, the coding system using large code words becomes ineffective.

SUMMARY OF THE INVENTION

The invention relates to a method of improving iterative decoding of short codes within a demodulator, characterized in that it comprises at least the following steps:
  decoding the vector of metrics of the bits considered at the output of the demodulator,
  comparing the value of the check code of the CRC of the decoded word with a predetermined value,
  If the value of the CRC is considered to form an acceptable message for the decoding step, transmitting the decoded word to the recipient, the super decoder transmits the decoded word,
  If the value of the CRC is incompatible with a correctly decoded message, then modifying the parameters for iterative decoding of the initial message that were received from the demodulator and executing at least one new iterative decoding step with these new parameters. The super decoder modifies the iterative-decoding parameters.

The value of the CRC is defined, for example, so that the overall coding rate is not changed by the insertion of the CRC, by virtue of a puncturing performed in the iteratively decoded code.

It is possible to use an existing CRC, starting from the same initialization vector provided by the demodulator.

The second decoding is performed, for example, starting from a different initialization vector from the initialization vector provided by the demodulator, when the corrective vector, representing the difference between the initial vector and the vector on which the new decoding is attempted, is obtained by an anti-gradient of the last half-iterations. The anti-gradient consists of a sparse matrix where only the N_correct nonzero coefficients correspond to the least reliable values decoded during the last half-iteration of the one but last (or two but last) half-iterations of the turbo code. N_correct typically equals ¾*d_free, where d_free is the distance of the code, and the coefficients of the matrix are each of opposite sign to the value decoded during the one but last iteration.

It is possible to execute the second decoding starting from a different initialization vector from the initialization vector provided by the demodulator, when the corrective vector, representing the difference between the initial vector and the vector on which the new decoding is attempted, is provided by a noise of low amplitude corresponding to a low temperature in a simulated annealing procedure.

For the second decoding, a noise, in accordance with the steps described above, is injected on a reduced number of points at the input of the decoder. This reduced number of points is of the order of the free distance of the code, and the points correspond to the least reliable values arising from the one but last or several but last iterations.

The second superiteration is repeated, for example, for various bit positions. The inverted bit position is taken a priori (as for a simulated annealing) or a posteriori by virtue of the decoding of the first superiteration (as for an inverse gradient). The new successive input vectors therefore consist of the vector initially received, but in which a value has been forced to the 0 bit (therefore to the minimum LLR) or to the 1 bit, that is to say to the maximum metric. The bit position inverted (with respect to the decoded value) during the various successive superiterations is random or follows the order of increasing reliability, that is to say beginning with the least reliable of the decoded bits.

The number of superiterations is greater than two and the starting point of the new superiteration consists, for example, of the initial point output by the demodulator, and of a corrective vector whose size (number of nonzero coordinates) or weight (Euclidean norm) can vary as a function of the iteration (typically increasing) or is fixed.

The number of superiterations is greater than 2 and the starting point of the new superiteration consists, for example, iteratively therefore, of the entry point of the previous superiteration, and of a corrective vector whose size or weight is or is not fixed. The number of superiterations is limited by a maximum fixed a priori. The superiterations stop as soon as the CRC found corresponds.

The invention exhibits notably the following advantages:
   A reduction in the signal-to-noise ratio necessary to obtain a given binary error rate,
   An indication of validity of the packet received so as for possible destruction by the higher protocol layers.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

The basic idea of the method according to the invention is notably to use a CRC check code (the abbreviation standing for Cyclic Redundancy Check) adapted to indicate, notably at the end of decoding either that the result obtained must be considered to be valid, exact CRC, or conversely that the decoded result cannot be in accordance with the message emitted. When the CRC is not correct, the decoder recommences a decoding from the first iteration, while however modifying the initial information received from the demodulator.

Figure 1:
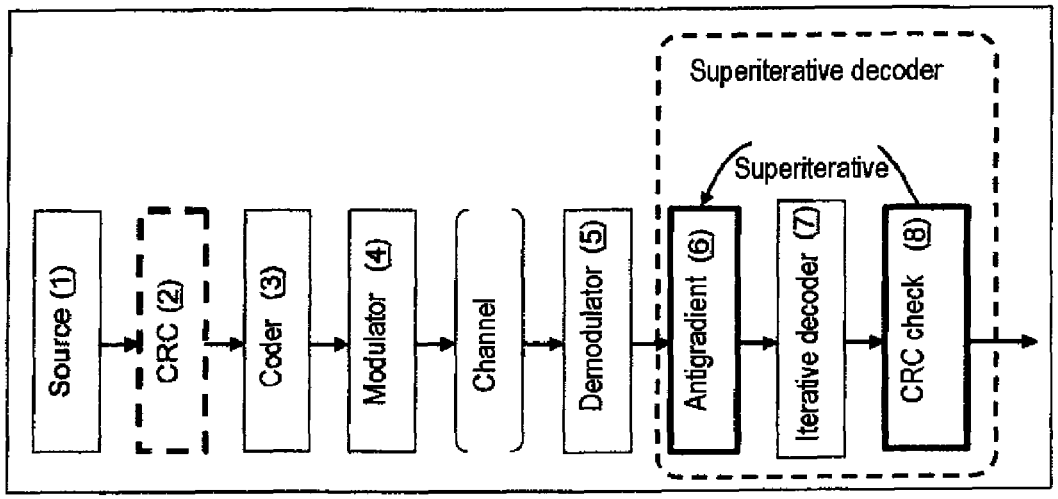
FIG. 1 the implementation diagram of the invention, indicating the blocks added: CRC (2), verification of the CRC (8) and retroaction function (6) and the action point of the decision feedback used by the invention, FIG. 2 indicates the gain of the invention in the case of an ATM cell (asynchronous transfer mode), and FIG. 3 indicates the gain of the invention in the case of an ATM cell.

The steps and the means implemented by the invention in the case where the decoding method already included a CRC are represented by solid lines in FIG. 1. A means making it possible to introduce a CRC at the coder level is represented by dashed lines.

The source 1 emits signals composed of bits which are coded by an iterative coder 3. The coded bits are thereafter transmitted to a modulator 4. The modulated bits travel through a propagation channel and are received by a receiver 5,6,7,8. The receiver comprises, for example, a demodulator 5 receiving the signal arising from the propagation channel. The demodulated signals are thereafter transmitted to a super-iterative decoder 6,7,8 exhibiting the characteristics of the invention and comprising notably an anti-gradient device 6, an iterative decoder 7 and a CRC check device 8.

The function of the controller 8 is notably to check the value of the CRC check code present in the signal with a value fixed beforehand. The decoding function is notably suitable for:
   Outputting the weighted information that it uses for the last iteration, for example the two iterations for a PCCC. The information arising from the decoding (raw soft output) is used, and not the extrinsic metric used during the iterative loopback,
   It is recalled that the "extrinsic metric" equation is equal to the information arising from the decoding or "raw soft output" the "intrinsic metric"
   The decoder is notably adapted to detect the end of code convergence. Various criteria known to the person skilled in the art can be used. The convergence criterion for decoding a TPC is extremely simple, since the decoding can stop as soon as the word corresponding to the output (raw soft output) of a half-iteration is a code word for the other iteration. Procedures exist in the same manner for the other codes with iterative decodings.

The information introduced into the CRC is, for example, a value of binary type, message acceptable or message incorrectly decoded. The method according to the invention implements notably the following steps:

A) Super encoding on emission:
   Addition of a CRC to the original message (in the case where it does not exist) or use of a CRC in the case where the high layers define it explicitly),
   Encoding of the original message by virtue of a code susceptible to iterative decoding.

B) Super decoding on reception:
   Decoding of the metric vector output by the demodulator, what is decoded is the vector of metrics of the bits considered at the output of the demodulator is decoded,
   Comparison of the value of the CRC check code of the decoded word with a predetermined value, for example the value of the CRC calculated on the decoded message,
   If the CRC calculated on the decoded word complies with the decoded value of the CRC, the value is considered to form an acceptable message for the decoding step, hence, the super decoder transmits the decoded word to the recipient,
   If the value of the CRC is not consistent, that is to say if the value of the CRC is incompatible with a correctly decoded message, then the super-decoder modifies the parameters for iterative decoding of the initial message that were received from the demodulator and executes at least one new iterative decoding step with these new parameters.
   The modification of the decoding parameters can then be a modification of the convergence speed, a modification of the calculation power, a modification such as detailed hereinafter of the inputs of the decoder.

For a device not comprising any "intrinsic verification (2)", the method comprises a step wherein this intrinsic verifier is added and the aforesaid decoding steps are executed thereafter.

According to a variant embodiment, a CRC is added, adapted to detect a false decoding and for relaunching a second iterative decoding, when the overall coding rate is decreased by the insertion of the CRC, the iteratively decoded code preserving its coding rate.

The CRC added is for example adapted to relaunch a second iterative decoding, when the overall coding rate is not changed by the insertion of the CRC, by virtue of a puncturing (that is to say the arbitrary deletion of certain coded bits, usually uniformly distributed in the coded message) performed in the decoded code, and the decoder is informed thereof by dispatching for the punctured bit a value corresponding to "no a priori information", usually the zero LLR (Log Likelihood Ratio).

According to an implementation variant, the method comprises, for example, an existing CRC adapted to relaunch a second iterative decoding, starting from the same initialization vector (i.e. the weighted values provided by the demodulator) provided by the demodulator, with a more expensive decoding method which is, however, closer to the optimal.

According to an implementation variant, the method uses an already existing CRC to decide to relaunch a second iterative decoding, starting from the same initialization vector provided by the, but with a decoding method with slower convergence by using smaller weighting coefficients for the extrinsic metric than during the first decoding. This second decoding can also use more iterations than the first attempt. The conventional iterative decoding provided by the conventional decoder comprises several iterations.

At the end of these iterations, the "decoder 7" provides the "CRC comparator 8" with the decoded information.

The CRC comparator then chooses to validate the result proposed by the decoder, or chooses to request "the inverse gradient operator 6" for a new starting point for a new decoding of the code word to be decoded. This new decoding will then take several iterations.

In a second variant embodiment, the second decoding is executed starting from a different initialization vector from the initialization vector provided by the demodulator. The corrective vector, representing the difference between the initial vector and the vector on which the new decoding is attempted, is provided by a noise of low amplitude (low temperature) following a simulated annealing procedure.

In another variant embodiment, the second decoding can be executed starting from a different initialization vector from the initialization vector provided by the demodulator, when the corrective vector, representing the difference between the initial vector and the vector on which the new decoding is attempted, is provided by the anti-gradient of the last half-iterations.

The anti-gradient consists of a sparse matrix where only the N_correct nonzero coefficients correspond to the least reliable values decoded during the last half-iteration of the one but last (or two but last) half-iteration of the turbo code. N_correct typically equals ¾*d-free, where d free is the distance of the code, and the coefficients of the matrix are each of opposite sign to the value decoded during the one but last iteration.

The number of the values retained nonzero in this anti-gradient is typically of the order of three quarters of the free distance of the code without this value being obligatory. The absolute value of the nonzero points of the anti-gradient is typically equal to half the mean metric. Their sign is inverse to the decision corresponding to decoding.

According to another implementation variant, the second decoding is a combination of the previous two procedures, when the corrective vector, representing the difference between the initial vector and the vector on which the new decoding is attempted, is zero on the points exhibiting a significant decoded metric, and a random noise (for example Gaussian) on the points corresponding to less good convergence, characterized by a low decoded metric.

According to a variant embodiment, the second decoding is executed starting from a different initialization vector from the initialization vector provided by the demodulator, when the corrective vector, representing the difference between the initial vector and the vector on which the new decoding is attempted, is provided by a noise of low amplitude corresponding to a low temperature in a simulated annealing procedure.

For the second decoding, a noise, as described previously, is injected on a reduced number of points at the input of the decoder. This reduced number of points is of the order of the free distance of the code, and the points correspond to the least reliable values arising from the one but last or several but last iterations.

In a sub-variant of this decoding by modification of the initialization vector, the second decoding is for example of multi-assumption type and consists in forcing a decoded bit to a given value, corresponding for example to the inverse of the value found by the decoding of the first superiteration; the corrective vector then corresponds to a hard decision, and forces the metric (LLR) of the bit considered to the maximum value corresponding to an extremely safe bit. The second superiteration is repeated for various positions of bits. The position of the inverted bit is taken a priori (as for a simulated annealing) or a posteriori by virtue of the decoding of the first superiteration (as for an inverse gradient). The new successive input vectors consist therefore of the vector initially received, but in which a value has been forced to the 0 bit (therefore to the minimum LLR) or to the 1 bit, that is to say to the maximum metric. The position of the inverted bit (with respect to the decoded value) during the various successive superiterations is random or follows the order of increasing reliability, that is to say by beginning with the least reliable of the decoded bits.

The number of superiterations can be greater than two and the starting point of the new superiteration consist of the initial point output by the demodulator, and of a corrective vector whose size (number of nonzero coordinates) or weight (Euclidean norm) can vary as a function of the iteration (typically increasing) or be fixed.

The number of superiterations is for example greater than 2 and the starting point of the new superiteration consists, iteratively therefore, of the entry point of the previous superiteration, and of a corrective vector whose size or weight is or is not fixed.

The number of superiterations is limited by a maximum fixed a priori. The superiterations stop as soon as the CRC found corresponds.

The rest of the description relates to two examples of implementing the method, that are given by way of wholly nonlimiting illustration.

Figure 2:
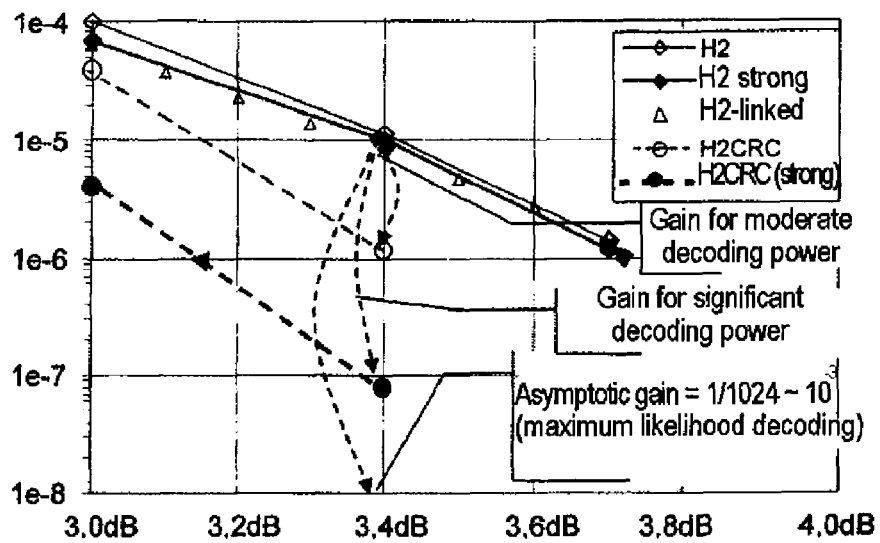
Figure 3:
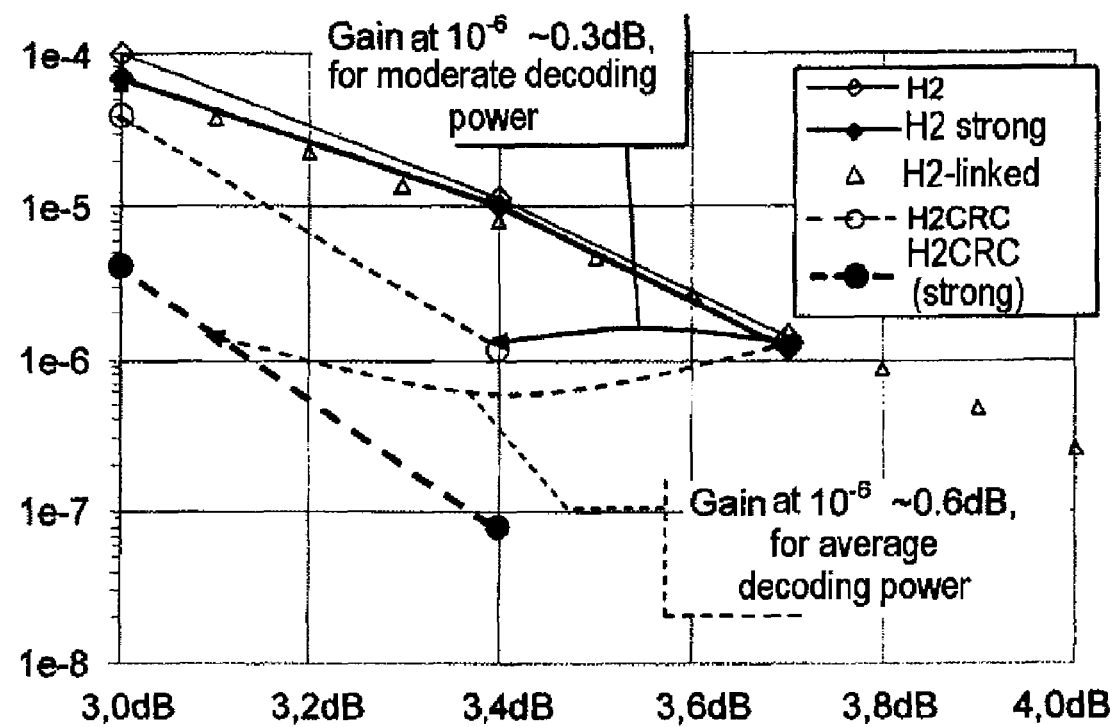

FIGS. 2 and 3 express the gain from a theoretical viewpoint; gain in BER (binary error rate) for a given signal-to-noise ratio.

EXAMPLE 1

The graph represented in FIGS. 2 and 3 shows the benefit of the method within the framework of a hiperlan2-like turbo code: a product turbo code based on a BCH(26,32,t=1) extended by parity check, thereby guaranteeing it a free distance of 4 for each component (row/column) for a spectral component which substantially equals:

$$S_{row} = S_{column} = 1000.$$

The free distance is therefore $d_{free} = d_1 * d_2 = 4*4 = 16$ and the first term of the spectrum of the product code is $S_{TPC} = S_1 * S_2 = 1000*1000$.
The first component of the bound of the union is therefore substantially:

$$PER \sim\, = S_{TPC} \cdot Q(d_{free} \cdot 2 \cdot Eb/No)$$

$$\text{where } Q(x) = \frac{1}{\sqrt{2p}} \int_x^{+\infty} \exp\left(\frac{u2}{2}\right) du$$

Here the code transports 80 bytes=640 bits. These 80 bytes are protected by 10 CRC bits. The 10 bits added in the information are punctured randomly in the product code so as to keep the coding rate strictly equal to that of the conventional code. The initial product code is shortened by a row.

In the initial code, 10 padding bits (arbitrarily taken equal to zero) are added to the 640 bits for entry to the initial matrix 650=26*25.

The coder adds redundancy bits in a conventional manner, up to concurrence of 31*32=992 bits. The coder extracts 10 padding bits, which do not need to be transmitted, and provides 982 bits to the modulator, i.e. a coding rate of 640/982=0.65173 . . . around 2/3.

The new coder adds 10 CRC bits (for example). It therefore does not have to add padding bits. The product code outputs 992 bits, none a padding bit. The new coder therefore punctures 10 coded bits at determined positions. These positions do not form the subject of the method.

EXAMPLE 2

A practical example is given on a small code, comprising 96 data bits, 4 CRC bits, and protected by a BCH(11) extended by parity on the rows and the columns and shortened by a row and a column.

The rate of the code without CRC is 96/221. In this example with conservation of the coding rate, the code with CRC is therefore punctured by 4 bits.

The input matrix is therefore the following, considering that the initial information is uniformly zero.

The redundancy is in italics, the CRC is in bold, and the 4 punctured positions are marked ??, and correspond to a zero metric.

Decoder Input:

| 7 | 1 | -5 | 30 | 19 | 0 | 31 | 14 | 3 | 26 | *19* | *19* | *32* | *25* | *9* |
|---|---|---|---|---|---|---|---|---|---|---|---|---|---|---|
| 12 | 5 | 13 | 18 | 28 | 14 | 17 | 25 | 10 | 16 | *8* | *22* | *15* | *9* | *6* |
| 19 | 0 | 13 | 19 | 17 | 18 | -15 | 22 | 25 | ?? | *11* | *27* | *14* | *19* | *10* |
| 27 | 38 | 19 | 19 | 5 | 13 | 18 | -13 | 34 | -8 | *15* | *6* | *28* | *15* | *16* |
| 22 | 37 | 18 | 15 | 13 | 16 | 19 | 12 | 18 | 26 | *7* | *10* | *15* | *21* | *-5* |
| 18 | 22 | 34 | 10 | 5 | ?? | 18 | 19 | 10 | 22 | *5* | *16* | *16* | *24* | *36* |
| 14 | 26 | 19 | 26 | 24 | 18 | 24 | 7 | 12 | 13 | *21* | *35* | *31* | *20* | *21* |
| 4 | -8 | 36 | -13 | 19 | 26 | 17 | 10 | -1 | 19 | *8* | *-13* | *32* | *32* | *26* |
| 25 | 39 | 47 | 5 | 2 | 6 | 4 | 7 | 33 | 14 | *42* | *34* | *22* | *14* | *15* |
| 5 | -6 | 13 | 3 | 0 | 21 | 4 | 2 | 2 | 11 | *25* | *8* | *-3* | *-3* | *??* |
| *9* | *16* | *-3* | *0* | *23* | *42* | *8* | *11* | *8* | *-23* | *6* | *3* | *1* | *-6* | *7* |
| *44* | *19* | *29* | *13* | *5* | *18* | *28* | *-4* | *0* | *2* | *12* | *12* | *18* | *3* | *34* |
| *23* | *9* | *8* | *23* | *28* | *19* | *21* | *30* | *-1* | *2* | *-2* | *12* | *3* | *10* | *26* |
| *30* | *10* | *11* | *??* | *13* | *5* | *-13* | *23* | *4* | *-4* | *3* | *13* | *15* | *4* | *33* |
| *8* | *11* | *-6* | *-2* | *21* | *1* | *36* | *40* | *14* | *21* | *22* | *13* | *10* | *19* | *4* |

Decoder Output after the First Superiteration:

| 59 | 29 | 40 | 30 | 62 | 55 | 52 | 31 | 30 | 55 | 55 | 42 | 74 | 46 | 45 |
|---|---|---|---|---|---|---|---|---|---|---|---|---|---|---|
| 51 | 29 | 43 | 32 | 74 | 55 | 46 | 35 | 37 | 58 | 45 | 46 | 52 | 25 | 48 |
| 60 | 13 | 41 | 7 | 50 | 59 | 10 | 38 | 42 | 31 | 41 | 42 | 45 | 46 | 41 |
| 51 | 51 | 40 | 15 | 37 | 49 | 10 | 3 | 50 | 31 | 41 | 6 | 70 | 44 | 41 |
| 74 | 60 | 47 | 30 | 50 | 57 | 37 | 37 | 44 | 53 | 47 | 29 | 42 | 34 | 41 |
| 65 | 52 | 52 | 7 | 37 | 50 | 37 | 47 | 37 | 57 | 39 | 35 | 45 | 54 | 62 |
| 58 | 69 | 48 | 43 | 72 | 66 | 57 | 32 | 47 | 48 | 58 | 61 | 60 | 55 | 54 |
| 51 | 13 | 60 | 7 | 55 | 56 | 10 | 3 | 30 | 41 | 39 | 6 | 68 | 44 | 54 |
| 63 | 77 | 71 | 16 | 41 | 49 | 39 | 31 | 59 | 51 | 76 | 57 | 68 | 40 | 46 |
| 51 | 13 | 41 | 7 | 37 | 50 | 10 | 3 | 30 | 41 | 54 | 6 | 42 | 25 | 41 |
| 51 | 50 | 40 | 7 | 55 | 66 | 10 | 3 | 35 | 31 | 39 | 6 | 42 | 25 | 45 |
| 78 | 50 | 49 | 21 | 41 | 55 | 50 | 32 | 35 | 46 | 46 | 30 | 52 | 25 | 61 |
| 59 | 29 | 40 | 41 | 54 | 58 | 39 | 45 | 30 | 46 | 45 | 42 | 46 | 49 | 57 |
| 66 | 13 | 46 | 7 | 37 | 49 | 10 | 39 | 35 | 31 | 39 | 29 | 42 | 34 | 45 |
| 51 | 33 | 41 | 16 | 48 | 49 | 60 | 42 | 37 | 56 | 60 | 30 | 46 | 51 | 45 | decision (Log Likelihood Ratio) for the decoding corre

The decoder output is more likely than the initial message: it is verified that the sums of the products metrics times sponding to the initial message (all zero) is less than that of the decoded message.

| Initial message | 267 | 219 | 246 | 166 | 222 | 217 | 217 | 205 | 171 | 147 | 202 | 217 | 249 | 206 | 238 |
|---|---|---|---|---|---|---|---|---|---|---|---|---|---|---|---|
| Decoded message | 267 | 227 | 246 | 148 | 222 | 217 | 221 | 185 | 171 | 217 | 202 | 209 | 249 | 206 | 238 |
| difference | 0 | 8 | 0 | −18 | 0 | 0 | 4 | −20 | 0 | 70 | 0 | −8 | 0 | 0 | 0 |

The calculation of the CRC gives a nonzero value for the decoded message for the TPC alone.

The analysis below charts the values of the following twelve numbers as having the smallest absolute value:

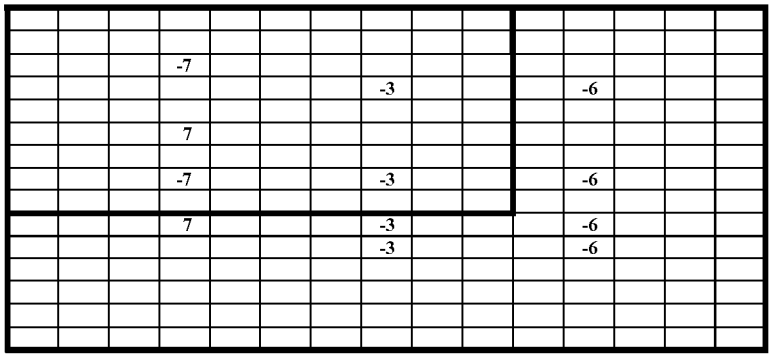

It therefore creates the retro stimuli.

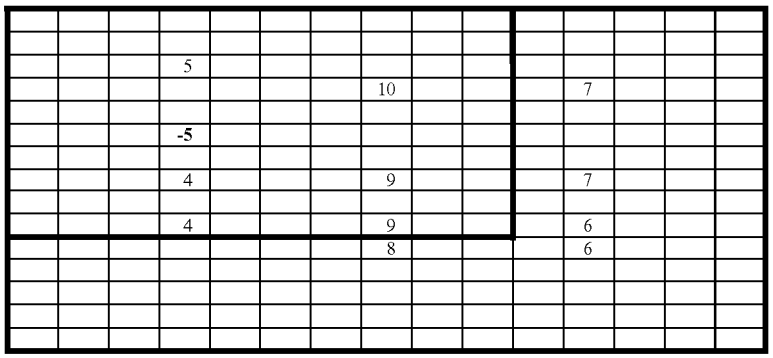

The new input for the second superiteration is therefore:

| 7 | 1 | -5 | 30 | 19 | 0 | 31 | 14 | 3 | 26 | 19 | 19 | 32 | 25 | 9 |
|---|---|---|---|---|---|---|---|---|---|---|---|---|---|---|
| 12 | 5 | 13 | 18 | 28 | 14 | 17 | 25 | 10 | 16 | 8 | 22 | 15 | 9 | 6 |
| 19 | 0 | 13 | 24 | 17 | 18 | -15 | 22 | 25 | 0 | 11 | 27 | 14 | 19 | 10 |
| 27 | 38 | 19 | 19 | 5 | 13 | 18 | -3 | 34 | -8 | 15 | 13 | 28 | 15 | 16 |
| 22 | 37 | 18 | 15 | 13 | 16 | 19 | 12 | 18 | 26 | 7 | 10 | 15 | 21 | -5 |
| 18 | 22 | 34 | 5 | 5 | 0 | 18 | 19 | 10 | 22 | 5 | 16 | 16 | 24 | 36 |
| 14 | 26 | 19 | 26 | 24 | 18 | 24 | 7 | 12 | 13 | 21 | 35 | 31 | 20 | 21 |
| 4 | -8 | 36 | -9 | 19 | 26 | 17 | 19 | -1 | 19 | 8 | -6 | 32 | 32 | 26 |
| 25 | 39 | 47 | 5 | 2 | 6 | 4 | 7 | 33 | 14 | 42 | 34 | 22 | 14 | 15 |
| 5 | -6 | 13 | 7 | 0 | 21 | 4 | 11 | 2 | 11 | 25 | 14 | -3 | -3 | 0 |
| 9 | 16 | -3 | 0 | 23 | 42 | 8 | 19 | 8 | -23 | 6 | 9 | 1 | -6 | 7 |
| 44 | 19 | 29 | 13 | 5 | 18 | 28 | -4 | 0 | 2 | 12 | 12 | 18 | 3 | 34 |
| 23 | 9 | 8 | 23 | 28 | 19 | 21 | 30 | -1 | 12 | -2 | 12 | 3 | 10 | 26 |
| 30 | 10 | 11 | 0 | 13 | 5 | -13 | 23 | 4 | -4 | 3 | 13 | 15 | 4 | 33 |
| 8 | 11 | -6 | -2 | 21 | 1 | 36 | 40 | 14 | 21 | 22 | 13 | 10 | 19 | 4 |

The decoding then converges to the value of the initial message. The CRC is then obviously satisfied.

In the above example, the low number of CRC bits, 4 bits, allows an asymptotic gain of the procedure, reduced to a factor $2^4=16$ on the packet error rate.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of iterative decoding of short codes comprising:
    decoding an initialization vector of metrics of bits of the short codes considered at the output of a demodulator;
    comparing a value of a check code of a cyclic redundancy check (CRC) of a decoded word with a predetermined value;
    transmitting the decoded word to a recipient when the value of the CRC is considered to form an acceptable message for the decoding step; and
    modifying parameters for iterative decoding of initialization vector and executing at least one new iterative decoding step with these new parameters when the value of the CRC is incompatible with a correctly decoded message,
        wherein the at least one new iterative decoding is performed starting from a different initialization vector from the initialization vector provided by the demodulator, when a corrective vector, representing the difference between the initialization vector and the vector on which the new decoding is attempted, is obtained by an anti-gradient of a last half-iterations, an anitgradient consisting of the decoded values that are the least reliable during the last half-iteration of the one but last half-iteration, the number of values retained nonzero in this anti-gradient is of the order of three-quarters of a free distance of the code.

2. The method as claimed in claim 1, wherein the value of the CRC is defined so that an overall coding rate is not changed by the insertion of the CRC, by virtue of puncturing a bit performed in the iteratively decoded code by dispatching for the punctured bit a value corresponding to a "no a priori information".

3. The method as claimed in claim 1, wherein a second superiteration is repeated for various bit positions, the inverted bit position being taken a priori or a posteriori by virtue of the decoding of the first superiteration.

4. The method as claimed in claim 1, wherein a number of superiterations is greater than two and a starting point of a new superiteration consists of an initial point output by the demodulator, and of a corrective vector, wherein the corrective vector comprises a size and a weight.

5. The method as claimed in claim 1, wherein a number of superiterations is greater than 2 and a starting point of a new superiteration consists of an entry point of the previous superiteration, and of a corrective vector.

6. The method of claim 2, wherein the puncturing comprises arbitrary deletion of certain coded bits uniformly distributed in the short code.

7. The method of claim 2, wherein the "no a priori information" comprises a zero Log Likelihood Ratio.

8. The method of claim 4, wherein both the size and the weight of the corrective vector are fixed.

9. The method of claim 4, wherein at least one of the size or the weight of the corrective vector is variable.

10. The method of claim 4, wherein both the size and the weight of the corrective vector are variable.

11. The method of claim 5, wherein both the size and the weight of the corrective vector are fixed.

12. The method of claim 5, wherein at least one of the size or the weight of the corrective vector is variable.

13. The method of claim 5, wherein both the size and the weight of the corrective vector are variable.

* * * * *